United States Patent [19]

Ogawa

[11] Patent Number: 5,579,506
[45] Date of Patent: Nov. 26, 1996

[54] SEMICONDUCTOR MEMORY DEVICE HAVING MEANS FOR TEMPORARILY STORING OPERATION COMMAND DATA

[75] Inventor: Toshiyuki Ogawa, Hyogo-ken, Japan

[73] Assignee: Mitsubishi Denki Kabushiki Kaisha, Tokyo, Japan

[21] Appl. No.: 717,405

[22] Filed: Jun. 17, 1991

[30] Foreign Application Priority Data

Jun. 21, 1990 [JP] Japan .................................. 2-165214

[51] Int. Cl.$^6$ .................................................. G06F 13/28
[52] U.S. Cl. ................... 395/483; 395/492; 364/DIG. 1
[58] Field of Search ............................. 364/200 MS File, 364/900 MS File; 395/400 MS, 425 MS

[56] References Cited

U.S. PATENT DOCUMENTS

| | | | |
|---|---|---|---|
| 4,392,200 | 7/1983 | Arulpragasam et al. | 395/425 |
| 4,425,616 | 1/1984 | Woodell | 395/375 |
| 4,488,258 | 12/1984 | Stuger et al. | 395/146 |
| 4,805,137 | 2/1989 | Grant et al. | 395/325 |
| 4,933,840 | 6/1990 | Sera et al. | 395/425 |
| 4,933,900 | 6/1990 | Yamaguchi et al. | 365/189.03 |

OTHER PUBLICATIONS

M5M482128J-8, -10, -12 Mitsubishi LSIs 1058576-Bit Dual Port Dynamic Ram.

Primary Examiner—Reba I. Elmore
Attorney, Agent, or Firm—Lowe, Price, LeBlanc & Becker

[57] ABSTRACT

In a semiconductor memory device having a plurality of memory cell arrays, data input/output terminals receive information data and operations command data and also output information data read out from the memory cell arrays. An operation command buffer temporarily stores the operation command data. In response to a control signal, an operation block controls the information data to be written into the memory cell arrays and read therefrom in a manner determined by the operation command data supplied from the operation command buffer.

9 Claims, 14 Drawing Sheets

| DECODER INPUT | | | | INSTRUCTION | | OUTPUT VALUE FOR EACH Di Mi (TRUTH VALUE) | | | |
|---|---|---|---|---|---|---|---|---|---|
| A3 | A2 | A1 | A0 | | Di<br>Mi | 0<br>0 | 0<br>1 | 1<br>0 | 1<br>1 |
| 0 | 0 | 0 | 0 | D=0 | Zero | 0 | 0 | 0 | 0 |
| 0 | 0 | 0 | 1 | Di·Mi | AND1 | 0 | 0 | 0 | 1 |
| 0 | 0 | 1 | 0 | /Di·Mi | AND2 | 0 | 1 | 0 | 0 |
| 0 | 0 | 1 | 1 | Mi | NOP | 0 | 1 | 0 | 1 |
| 0 | 1 | 0 | 0 | Di·/Mi | AND3 | 0 | 0 | 1 | 0 |
| 0 | 1 | 0 | 1 | Di | Through | 0 | 0 | 1 | 1 |
| 0 | 1 | 1 | 0 | /Di·Mi+Di·/Mi | EOR | 0 | 1 | 1 | 0 |
| 0 | 1 | 1 | 1 | Di+Mi | OR1 | 0 | 1 | 1 | 1 |
| 1 | 0 | 0 | 0 | /Di+Mi | NOR | 1 | 0 | 0 | 0 |
| 1 | 0 | 0 | 1 | Di·Mi+/Di·/Mi | ENOR | 1 | 0 | 0 | 1 |
| 1 | 0 | 1 | 0 | /Di | NOT1 | 1 | 1 | 0 | 0 |
| 1 | 0 | 1 | 1 | /Di+Mi | OR2 | 1 | 1 | 0 | 1 |
| 1 | 1 | 0 | 0 | /Mi | NOT2 | 1 | 0 | 1 | 0 |
| 1 | 1 | 0 | 1 | Di+Mi | OR3 | 1 | 0 | 1 | 1 |
| 1 | 1 | 1 | 0 | /Di+/Mi | NAND | 1 | 1 | 1 | 0 |
| 1 | 1 | 1 | 1 | Di=1 | ONE | 1 | 1 | 1 | 1 |

INSTRUCTION CODE: F0→A3, F1→A1, F2→A2, F3→A0

| Nemonic & Function | | Command | | | | Write data to MC (Wi) | | | |
|---|---|---|---|---|---|---|---|---|---|
| | | A3 | A2 | A1 | A0 | Di  0 0 1 1 | | | |
| | | | | | | Mi  0 1 0 1 | | | |
| Zero | $Wi=0$ | 0 | 0 | 0 | 0 | 0 | 0 | 0 | 0 |
| AND1 | $Di \cdot Mi$ | 0 | 0 | 0 | 1 | 0 | 0 | 0 | 1 |
| AND2 | $Di \cdot \overline{Mi}$ | 0 | 0 | 1 | 0 | 0 | 0 | 1 | 0 |
| NOP | $Mi$ | 0 | 0 | 1 | 1 | 0 | 1 | 0 | 1 |
| AND3 | $\overline{Di} \cdot Mi$ | 0 | 1 | 0 | 0 | 0 | 1 | 0 | 0 |
| Through | $Di$ | 0 | 1 | 0 | 1 | 0 | 0 | 1 | 1 |
| EOR | $\overline{Di} \cdot Mi + Di \cdot \overline{Mi}$ | 0 | 1 | 1 | 0 | 0 | 1 | 1 | 0 |
| OR1 | $Di + Mi$ | 0 | 1 | 1 | 1 | 0 | 1 | 1 | 1 |
| NOR | $\overline{Di} \cdot \overline{Mi}$ | 1 | 0 | 0 | 0 | 1 | 0 | 0 | 0 |
| ENOR | $Di \cdot Mi + \overline{Di} \cdot \overline{Mi}$ | 1 | 0 | 0 | 1 | 1 | 0 | 0 | 1 |
| NOT1 | $\overline{Di}$ | 1 | 0 | 1 | 0 | 1 | 1 | 0 | 0 |
| OR2 | $\overline{Di} + Mi$ | 1 | 0 | 1 | 1 | 1 | 1 | 0 | 1 |
| NOT2 | $\overline{Mi}$ | 1 | 1 | 0 | 0 | 1 | 0 | 1 | 0 |
| OR3 | $Di + \overline{Mi}$ | 1 | 1 | 0 | 1 | 1 | 0 | 1 | 1 |
| NAND | $\overline{Di} + \overline{Mi}$ | 1 | 1 | 1 | 0 | 1 | 1 | 1 | 0 |
| ONE | $Wi=1$ | 1 | 1 | 1 | 1 | 1 | 1 | 1 | 1 |

FIG.16 PRIOR ART

SEMICONDUCTOR MEMORY DEVICE HAVING MEANS FOR TEMPORARILY STORING OPERATION COMMAND DATA

BACKGROUND OF THE INVENTION

1. Field of the Invention

The present invention relates generally to semiconductor memory devices and operation executing system using the same. More particularly, the present invention relates to an improvement of operation mode for such a dynamic random access memory as having a execution block contained in one chip.

2. Description of the Background Art

For example, numbers of dynamic RAMs are used in an image processing apparatus, wherein writing and reading of image data of the dynamic RAM is controlled by a CPU. However, since operation processing in a chip is more likely to reduce a processing speed required for processing some image, an integrated circuit containing a dynamic RAM and an operation execution block in one chip has been put into practical use.

Figure 13:
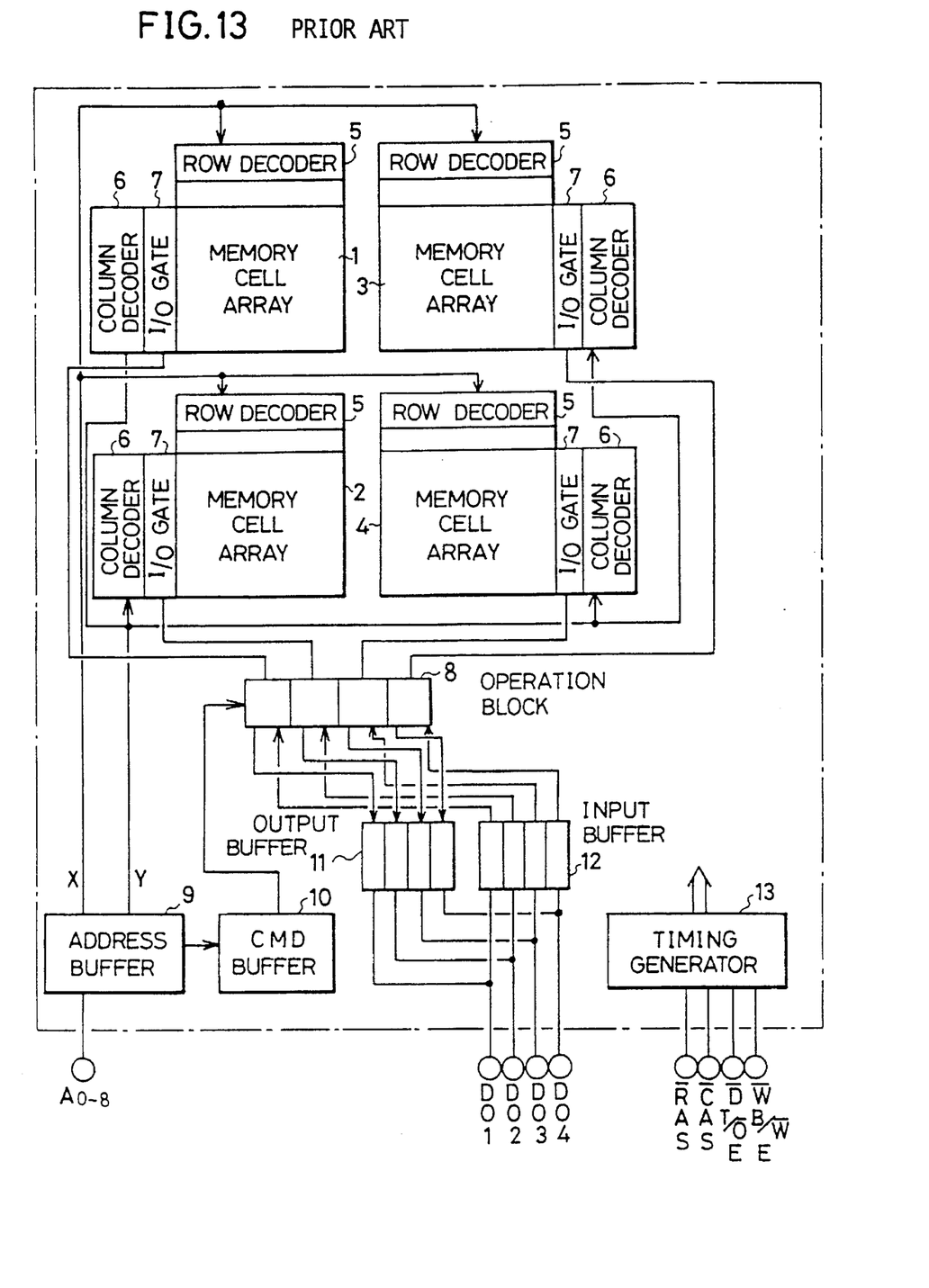
FIG. 13 is a schematic block diagram of a conventional semiconductor memory device.

FIG. 13 is a schematic block diagram of such integrated circuit. Referring to FIG. 13, memory cell arrays 1–4 have memory capacity of 512 rows and 512 columns corresponding to data input/output terminals DO1–DO4. Each of the memory cell arrays 1–4 has a row decoder 5, a column decoder 6 and an I/O gate 7 provided therein. Address input terminals A0–A8 receive row address (X) signals and column address (Y) signals as external address signals and also receive operation command CMD in a time divisional multiplexed manner, and then the external address signals are latched in an address buffer 9. Since address is a kind of command and different from data, the operation command CMD is input to the address input terminals A0–A8 but not to the data input/output terminals DO1–DO4. The row address signals latched in the address buffer 9 are applied to the row decoders 5 wherein one row is selected among 512 rows of each of the memory cell arrays 1–4, while the column address signals are applied to the column decoders 6 wherein one column is selected among the 512 columns in the memory cell array 1. Read data Mi of the selected address is applied to a operation execution block 8 through the I/O gate 7.

The above-described operation command CMD latched in the address buffer 9 is latched in a CMD buffer 10 and then applied to the operation block 8. The input/output terminals DO1–DO4 receive input data Di, the input data Di is latched in an input buffer 12 at each timing of signals, $\overline{RAS}$, $\overline{CAS}$, $\overline{WB/WE}$ and $\overline{DT/OE}$ input to control input terminals and then the latched input Di is applied to the operation block 8. The operation block 8 executes operations of the read date Mi and the input data Di latched in the input buffer 12 at the operation command CMD latched in the CMD buffer 10 and data Wi which are results of the executed operations are written in the memory cell arrays 1–4.

Figure 14:
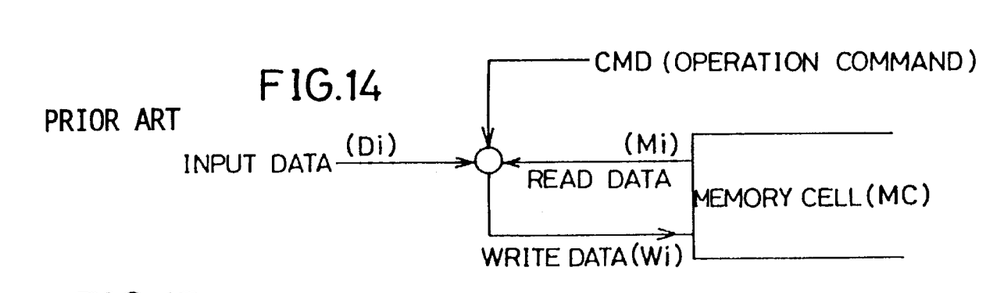
FIG. 14 is a diagram explaining an outline of an operation processing in an operation block shown in FIG. 13.
Figure 15:
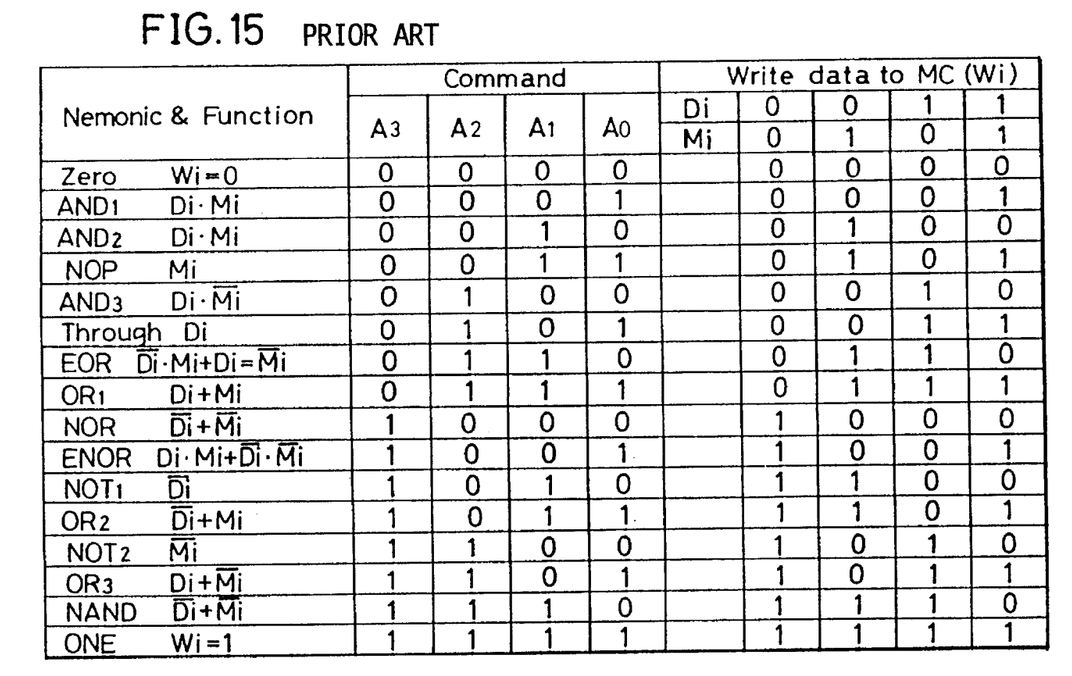
FIG. 15 is a table showing contents of the operation to be executed in the operation block.
Figure 16:
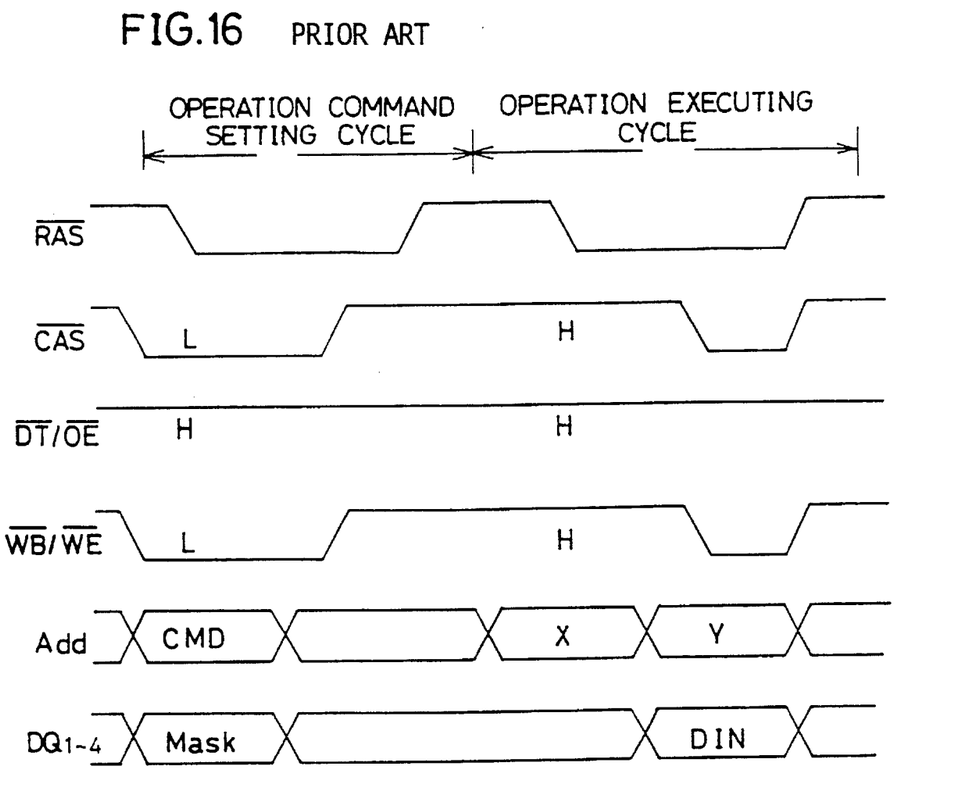
FIG. 16 is a timing chart showing an operation processing cycle of the conventional semiconductor memory device.

FIG. 14 is a diagram explaining a outline of an operation processing by the operation execution block in FIG. 13, FIG. 15 is a table showing the operation contents executed in the operation execution block and FIG. 16 is a timing chart showing operation processing cycles of a conventional semiconductor memory device.

Now, referring to FIG. 13–FIG. 16, operation of the conventional semiconductor memory device will be described. As shown in FIG. 16, in the first half of the operation command setting cycle, the operation command CMD is latched in the address buffer 9 and in the latter half of the operation executing cycle, an operation processing is performed in accordance with the latched operation command CMD, so that the data Wi of the result thereof is written in the memory cell arrays 1–4. Namely, when the row address strobe signal $\overline{RAS}$ attains the "L" (logical low) level, the column address strobe signal $\overline{CAS}$ attains the "L" level, the output enable signals $\overline{DT/OE}$ attains a "H" (logical high) level and the write enable signal $\overline{WB/WE}$ attains the "L" level, so that the operation command CMD is applied to the address input terminals A0–A8, the operation command CMD is latched in the CMD buffer 10 through the address buffer 9. At this time, write mask data is applied to the data input/output terminals DO1–DO4.

After the operation command is latched in the CMD buffer 10, the operation is executed in the latter half of the operation cycle as shown in FIG. 16. Namely, a predetermined address of each of the memory cell arrays 1–4 is specified by the row address strobe signal $\overline{RAS}$ and the column address strobe signal $\overline{CAS}$, so that the read data Mi is applied to the operation block 8, and the write enable signal $\overline{WB/WE}$ attains the "L" level, so that the input data Di input to the data input/output terminals DO1–DO4 is latched in the input buffer 12 and then applied to the operation block 8, whereby the operation is executed in accordance with the operation command CMD. As shown in FIG. 13, the operation command CMD comprises 4 bits (A0–A3) and an AND operation and an OR operation between the read data Mi and the input data Di are executed based on whether the bit is "0" or "1".

As described above, in the conventional semiconductor memory device, the operation command CMD is latched in the CMD buffer 10 in the first half of the operation command setting cycle and the operation block 8 executes the operation of the input data Di and the read data Mi in accordance with the operation command CMD in the latter half of the operation executing cycle, which makes neither setting nor execution of the operation command CMD in the same cycle possible, resulting in a longer processing time period.

SUMMARY OF THE INVENTION

Therefore, a primary object of the present invention is to provide a semiconductor memory device that allows setting and execution of operation command in the same cycle and an operation executing system using the same.

Briefly stated, the present invention comprises a plurality of semiconductor memory elements, address signal input terminals receiving address signals, data input/output terminals receiving write data and operation command data and outputting the data read out from the semiconductor memory elements, first and second control signal input terminals receiving first and second control signals, and a buffer temporarily storing operation command data, wherein the operation command data input to the data input/output terminals are temporarily stored in the buffer in response to a level change of the first control signal input to the first control signal input terminal, so that the data input to the data input/output terminals and the data read out from the semiconductor memory elements are operated in accordance with the operation command data stored in the buffer in response to a level change of the second control signal input to the second control signal input terminal.

Accordingly, in accordance with the present invention, by temporarily storing the operation command data in response to the level change of the first control signal and executing the operation of the data in response to the level change of the second control signal, it is possible to set the operation command data and perform the operation processing in the same cycle.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 7 and 8 are diagrams showing operation executing cycles according to one embodiment of the present invention, and particularly, FIG. 7 shows a case where the write enable signal $\overline{WB/WE}$ is set after the fall of the column address strobe signal $\overline{CAS}$ and FIG. 8 shows a case where the write enable signal $\overline{WB/WE}$ is set before the fall of the column address strobe signal $\overline{CAS}$.

DESCRIPTION OF THE PREFERRED EMBODIMENTS

Figure 1:
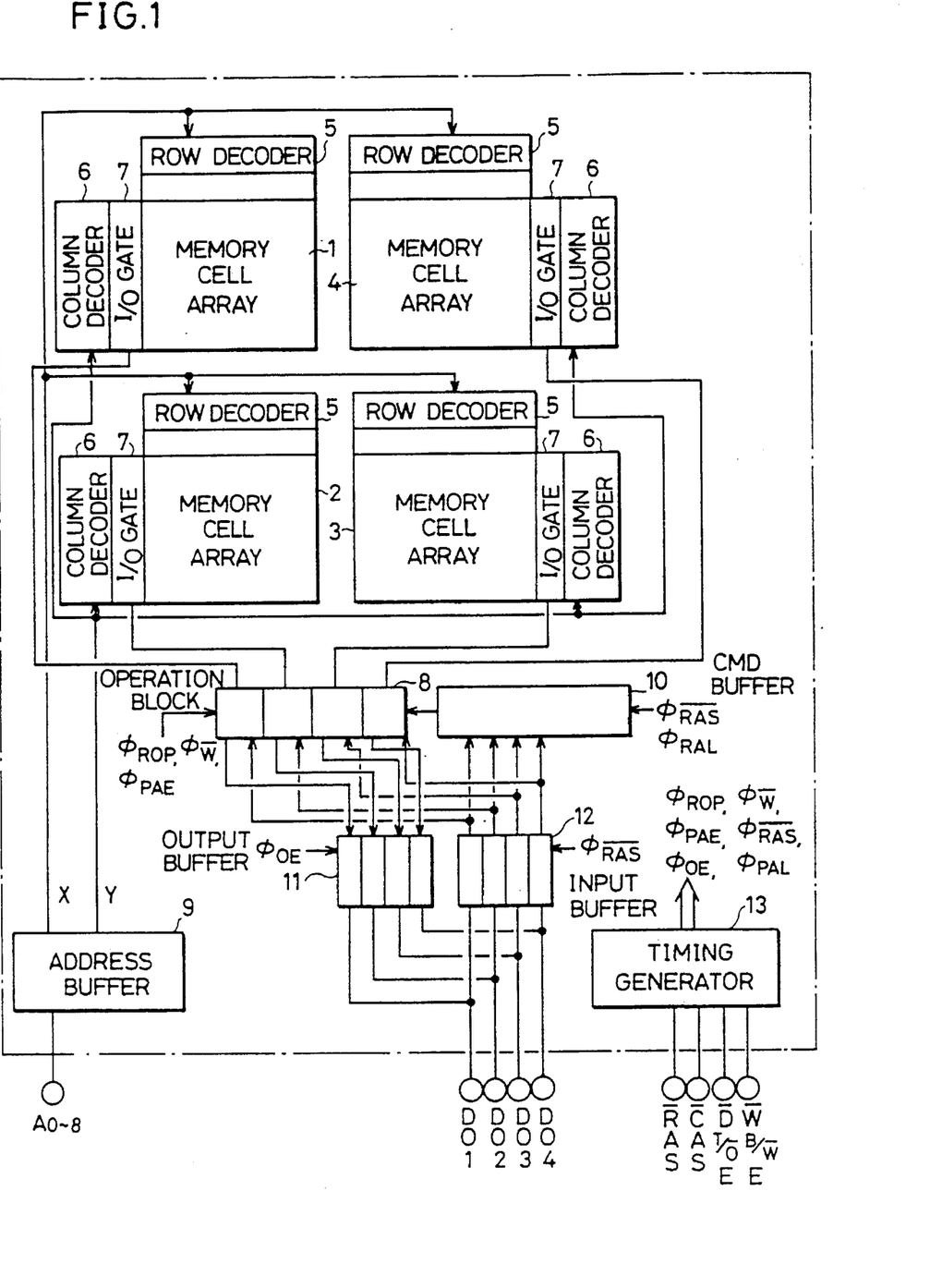
FIG. 1 is a schematic block diagram of one embodiment of the present invention.

FIG. 1 is the schematic block diagram of one embodiment of the present invention. A semiconductor memory device shown in FIG. 1 is similarly structured to that of the above-described FIG. 13 except for the following points. Namely, while in the above-described conventional semiconductor memory device of FIG. 13, the operation command CMD is input to the address signal input terminals A0–A8, in the embodiment shown in FIG. 1, the operation command CMD is applied to the data input/output terminals DO1–DO4 and then, the operation command CMD is latched in the CMD buffer 10 through the input buffer 12.

Figure 2:
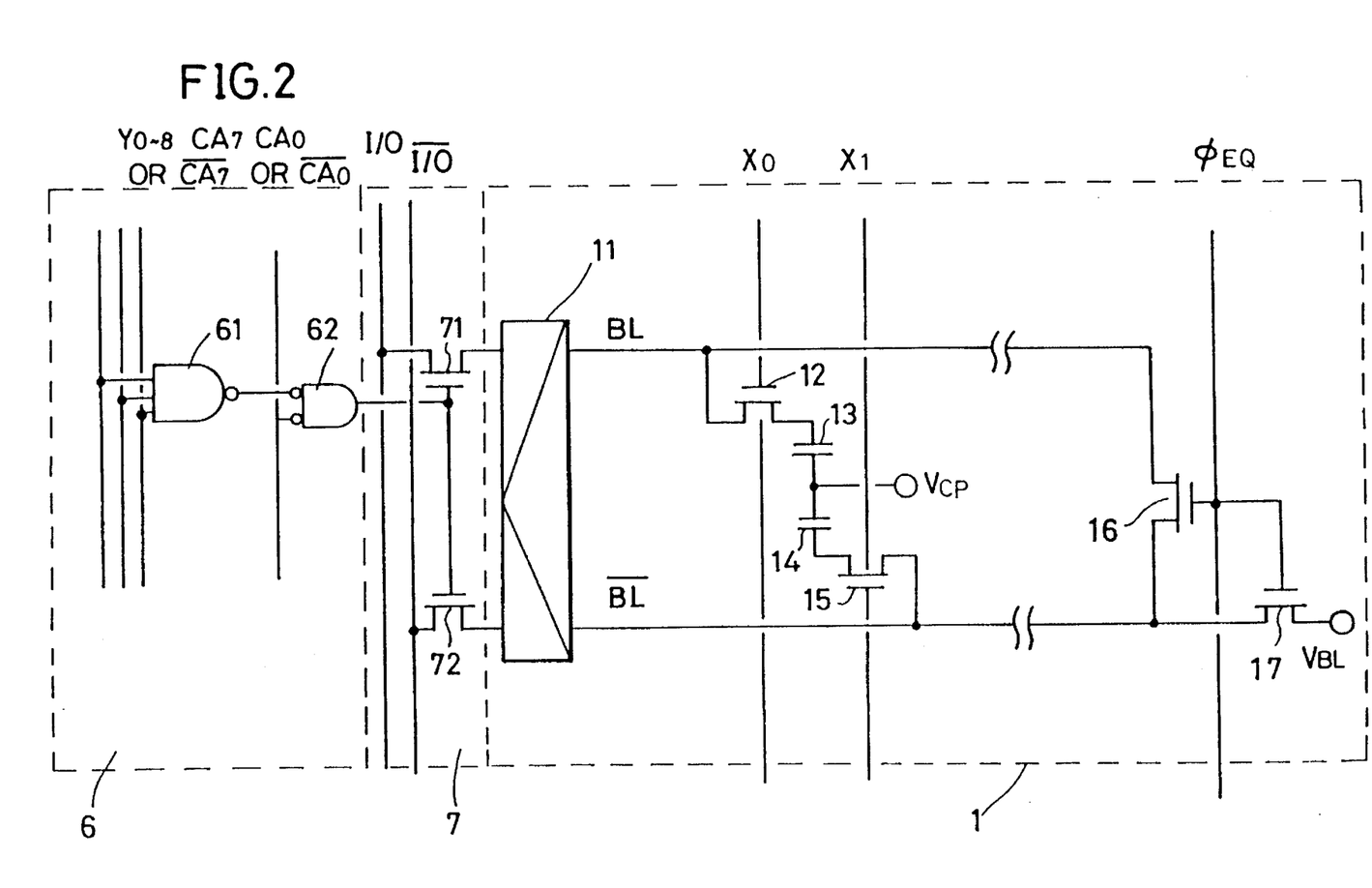
FIG. 2 is an electric circuit diagram of a peripheral portion of a memory cell shown in FIG. 1.

FIG. 2 is the electric circuit diagram of the peripheral portion of the memory cell array shown in FIG. 1. Referring to FIG. 2, included are a gate circuit 61 receiving column address signals which are 2 of y0–y8 and CA7 or $\overline{CA7}$ output from the address buffer 9 shown in FIG. 1 and a gate circuit 62 receiving an output of the gate circuit 61 and CA0 or $\overline{CA0}$.

The I/O gate circuit 7 comprises MOS transistors 71 and 72 each having a gate receiving the output of the gate circuit 62. The MOS transistor 71 has a drain connected to an I/O line and a source connected to the sense amplifier 11 of the memory cell array 1. The MOS transistor 72 has a drain connected to an $\overline{I/O}$ line and a source connected to the sense amplifier 11. The sense amplifier 11 is connected to bit lines BL and $\overline{BL}$, a memory transistor 12 is connected between the bit line BL and a row address signal X0 and a memory transistor 15 is connected between the bit line $\overline{BL}$ and a row address signal X1. Capacitors 13 and 14 are respectively connected between sources of the memory transistors 12 and 15 and a power supply Vcp, which constitutes a dynamic RAM having one transistor and capacitor. A MOS transistor 16 has a drain and a source connected between the bit lines BL and $\overline{BL}$ and a gate receiving a clock signal $\phi_{EQ}$. Furthermore, a bit line voltage $V_{BL}$ is applied to the bit line $\overline{BL}$ through a MOS transistor 17.

Figure 3:
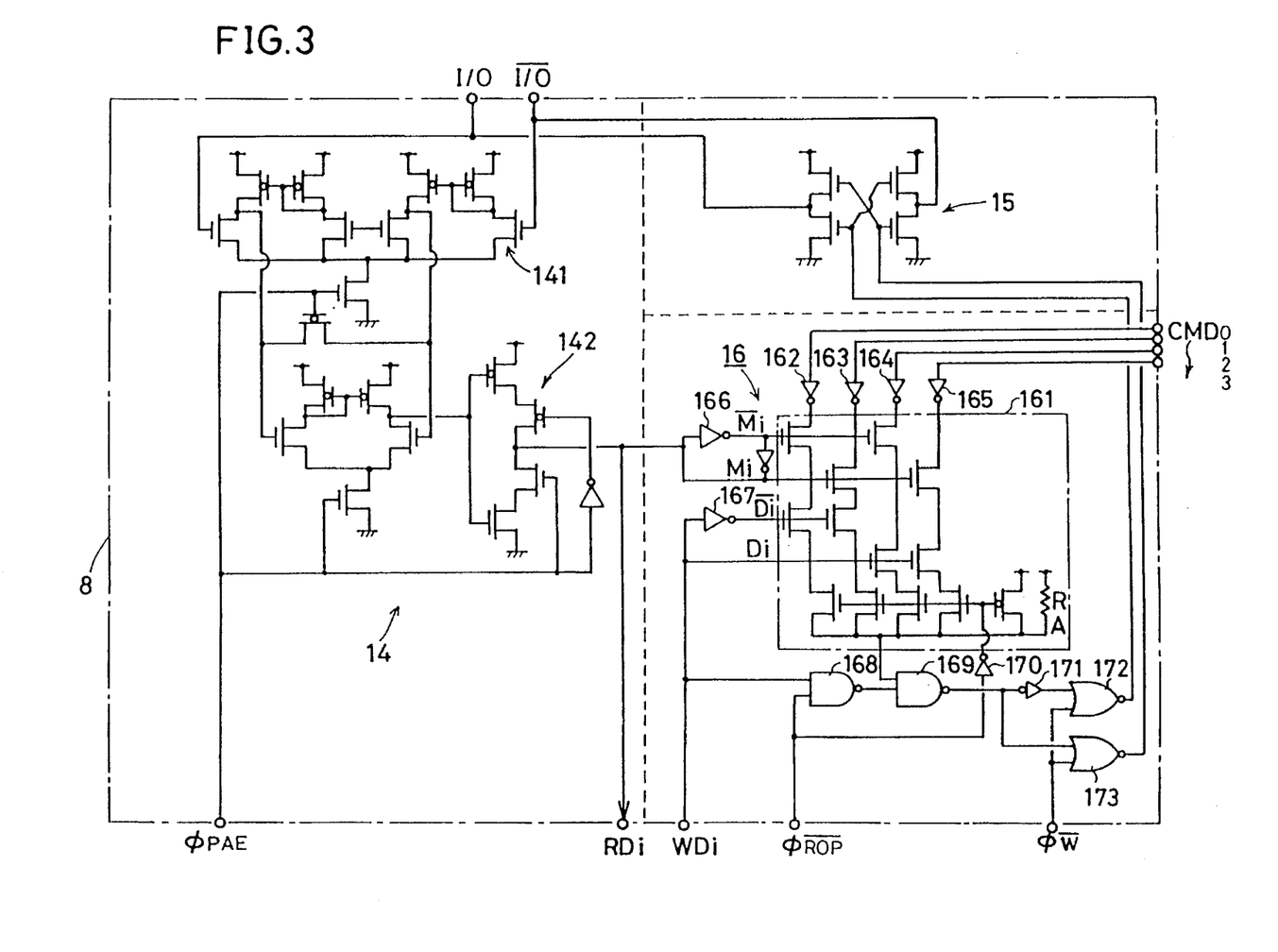
FIG. 3 is a specific electric circuit diagram of an operation block shown in FIG. 1.
Figure 4:
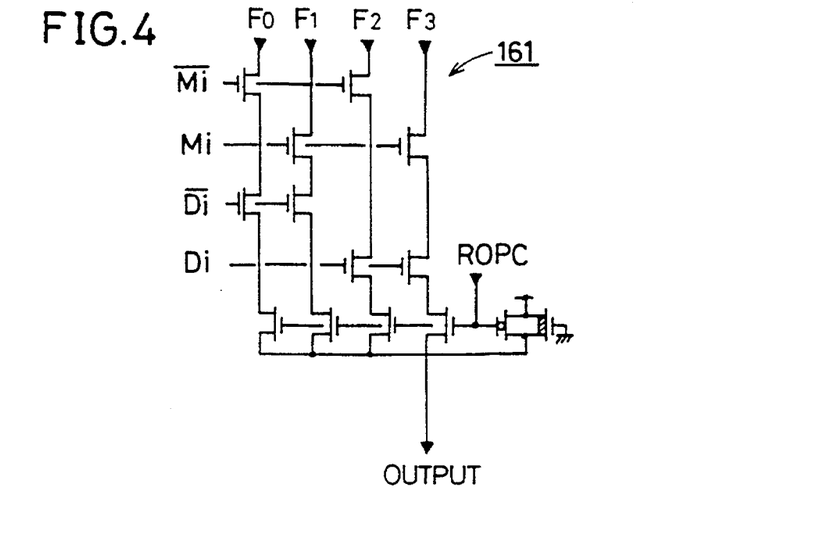
FIG. 4 is a diagram showing a function block included in the operation block showing in FIG. 3.
Figure 5:
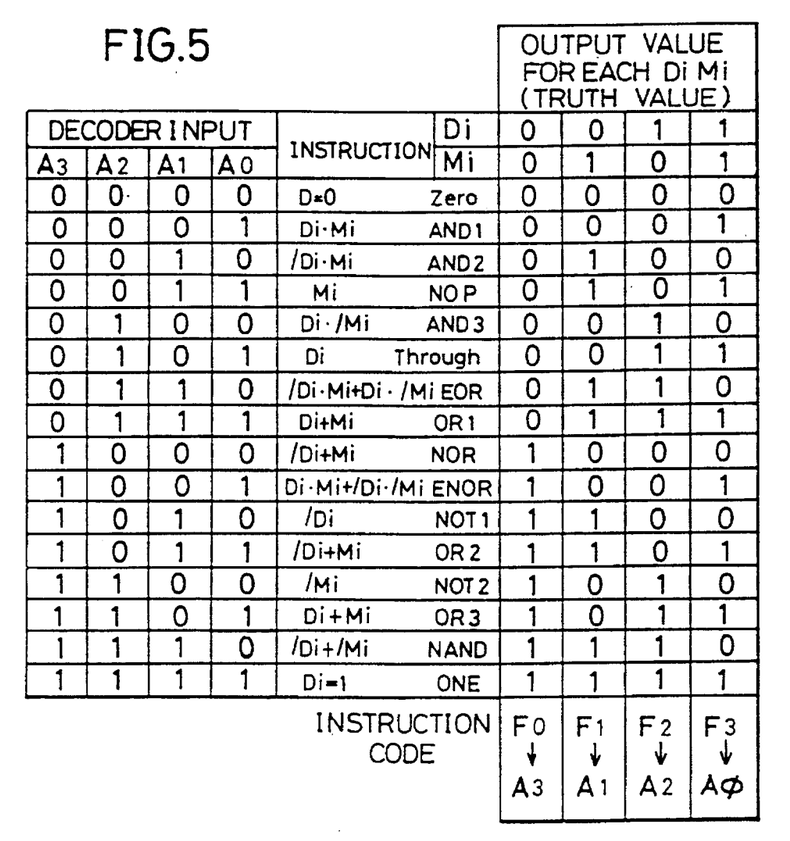
FIG. 5 is a diagram showing examples of instruction words for performing an operation processing in the function block shown in FIG. 4.

FIG. 3 is the specific electric circuit diagram of the operation block shown in FIG. 1, FIG. 4 is the diagram showing the function block included in the operation block shown in FIG. 3 and FIG. 5 is the diagram showing the examples of instruction words to be operated in the function block shown in FIG. 4.

Referring to FIG. 3, the operation block 8 comprises a preamplifier 14, a writing driver 15 and an operation processing block 16. The preamplifier 14 is for amplifying a level difference between data I/O and $\overline{I/O}$ read out from the I/O gate 7 and includes an amplifier 141 comprised of two stages of current mirror circuits. When a clock signal $\phi_{PAE}$ is input, the amplifier 141 amplifies the difference between the data I/O and $\overline{I/O}$ and latches the amplified difference. The clock signal $\Phi_{PAE}$ is applied to the operation processing block 16 through a clocked inverter 142.

The operation processing block 16 includes such a function block 161 as shown in FIG. 4, wherein, after inverted in inverters 162–165, instruction commands CMD0, CMD1, CMD2 and CMD3 are input to command inputs F0, F1, F2 and F3, thereby enabling execution of 16 types of instructions as shown in FIG. 5. Furthermore, read data RDi is input to an input end Mi and it is also input to an input end $\overline{Mi}$ after being inverted in an inverter 166, and write data WDi is input to an input end Di and it is also input to an input end $\overline{Di}$ after being inverted in an inverter 167 in the function block 161. A clock signal is $\phi_{\overline{ROP}}$ applied to the function block 161 in order to precharge a node A thereof, such that penetrating currents flowing from the function block 161 to an NAND gate 169 can be reduced.

The execution data executed in the function block 161 is applied from the node A to one input end of the NAND gate 169, and the output of NAND gate 169 is applied to one input end of an NOR gate 173 and it is also inverted in an inverter 171 and then applied to one input end of an NOR gate 172. Write clock signal $\phi_{\overline{W}}$ is applied to the other input ends of the NOR gates 172 and 173. Outputs of the NOR gates 172 and 173 are applied to a writing driver 15. The writing driver 15 drives the result of the operation and outputs the same to the I/O gate 7.

Figure 6:
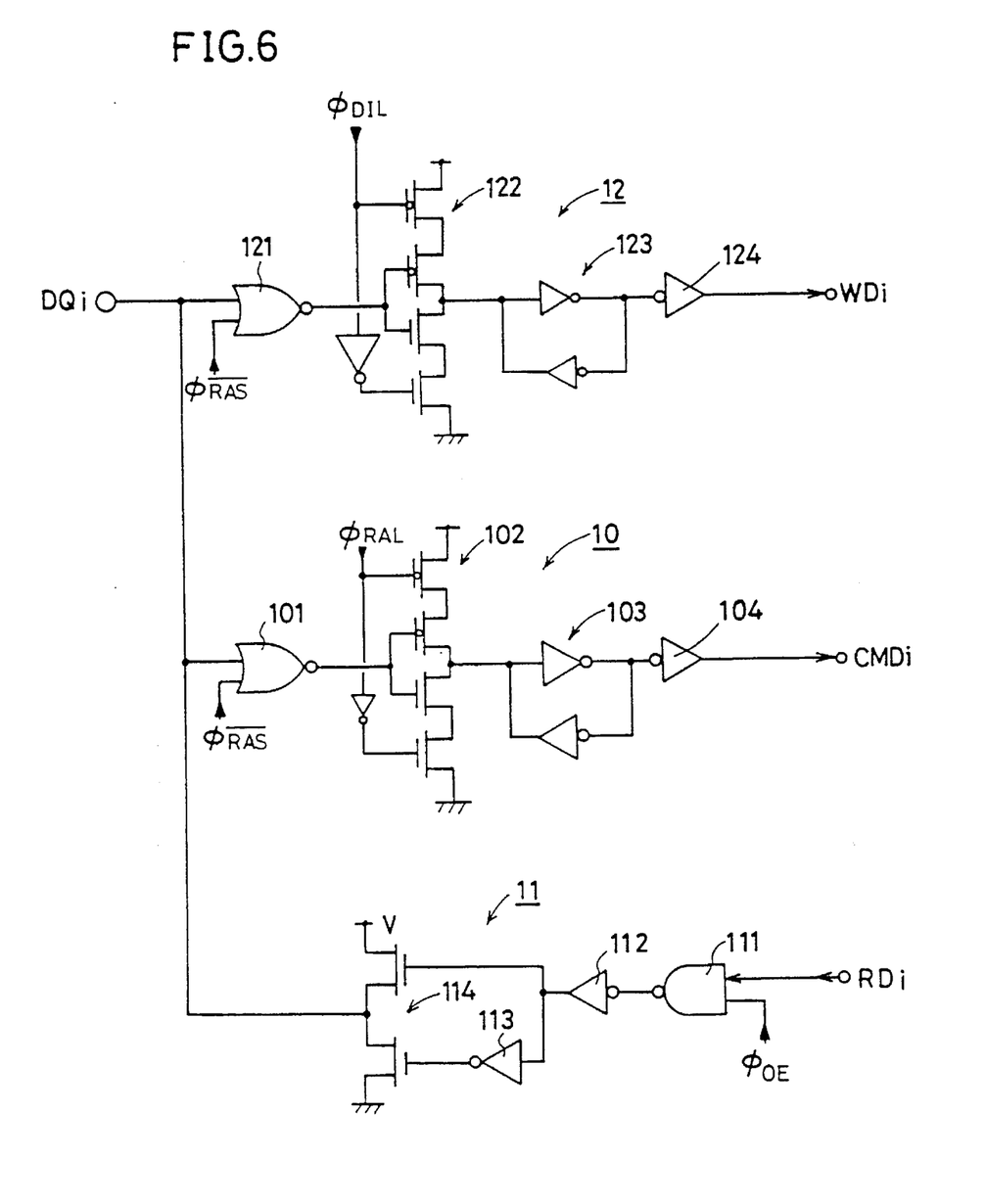
FIG. 6 is a specific block diagram of an input buffer, a command buffer and an output buffer shown in FIG. 1.

FIG. 6 is the specific block diagram of the input buffer, the command buffer and the output buffer shown in FIG. 1. Referring to FIG. 6, the input buffer 12 comprises an NOR gate 121, a clock driver 122, a latch 123 and an inverter 124.

The NOR gate 121 has one input end receiving input data input to a data input/output end DOi (i=1–4) and the other input end receiving a clock signal $\Phi_{\overline{RAS}}$. The NOR gate 121 applies the input data to the clock driver 122 in synchronization with the clock signal $\Phi_{\overline{RAS}}$. The clock driver 122 causes the latch 123 to latch the input data in synchronization with a clock signal $\Phi_{DIL}$. The output of the latch 123 is inverted in the inverter 124 and the inverted output is applied as the writing data to the operation processing block 16 shown in FIG. 3.

Similarly to the input buffer 12, the command buffer 10 comprises an NOR gate 101, a clock driver 102, a latch 103 and an inverter 104, in which the operation command CMD input to the data input/output terminal DOi is applied to the above-described operation block 16 shown in FIG. 3.

The output buffer 11 comprises an NAND gate 111, inverters 112 and 113 and an output driver 114. The NAND gate 111 has one input end receiving the read data RDi output from the preamplifier 14 shown in FIG. 3 and the other input end receiving the clock signal $\Phi_{OE}$. The NAND gate 111 outputs the read data RDi to the data input/output end DOi through the inverters 112 and 113 and the output driver 114 in synchronization with the clock signal $\Phi_{OE}$.

Figure 7:
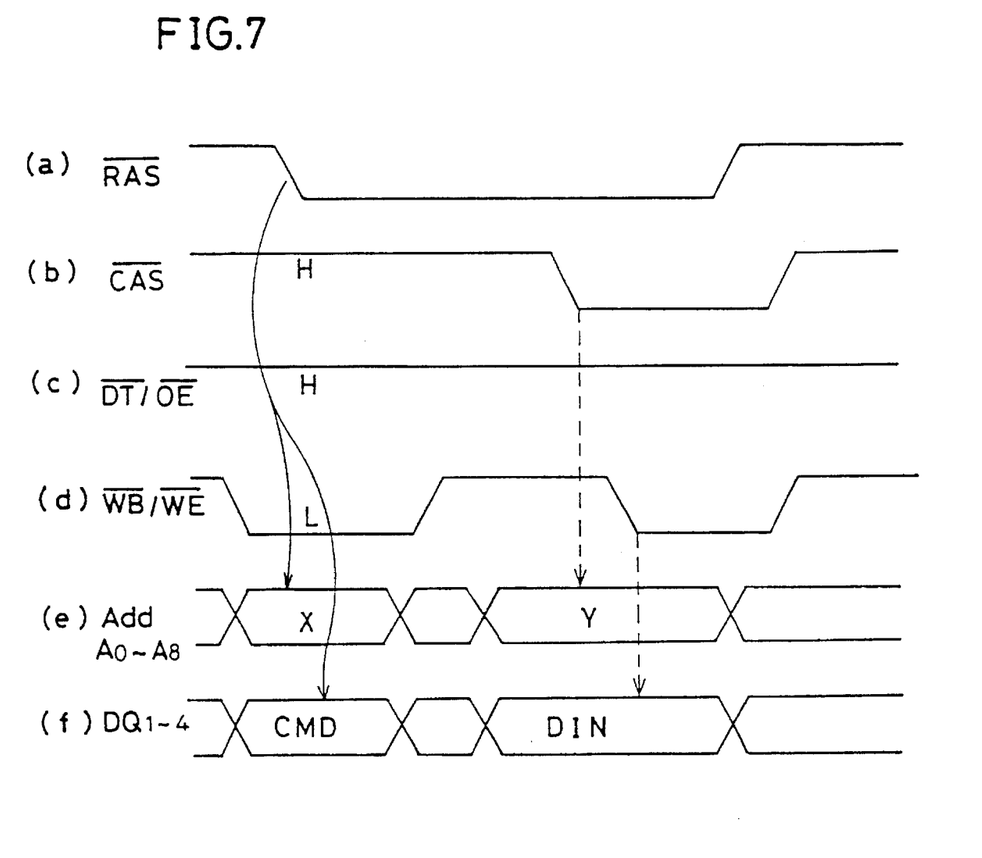
Figure 8:
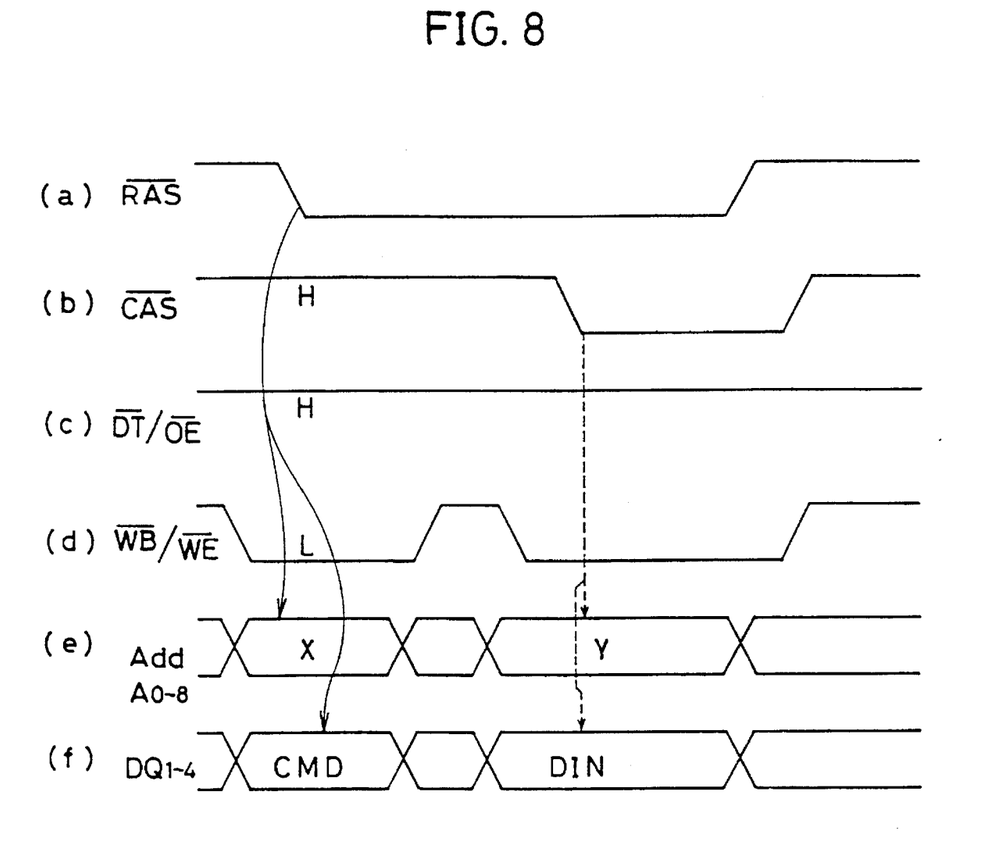
Figure 9:
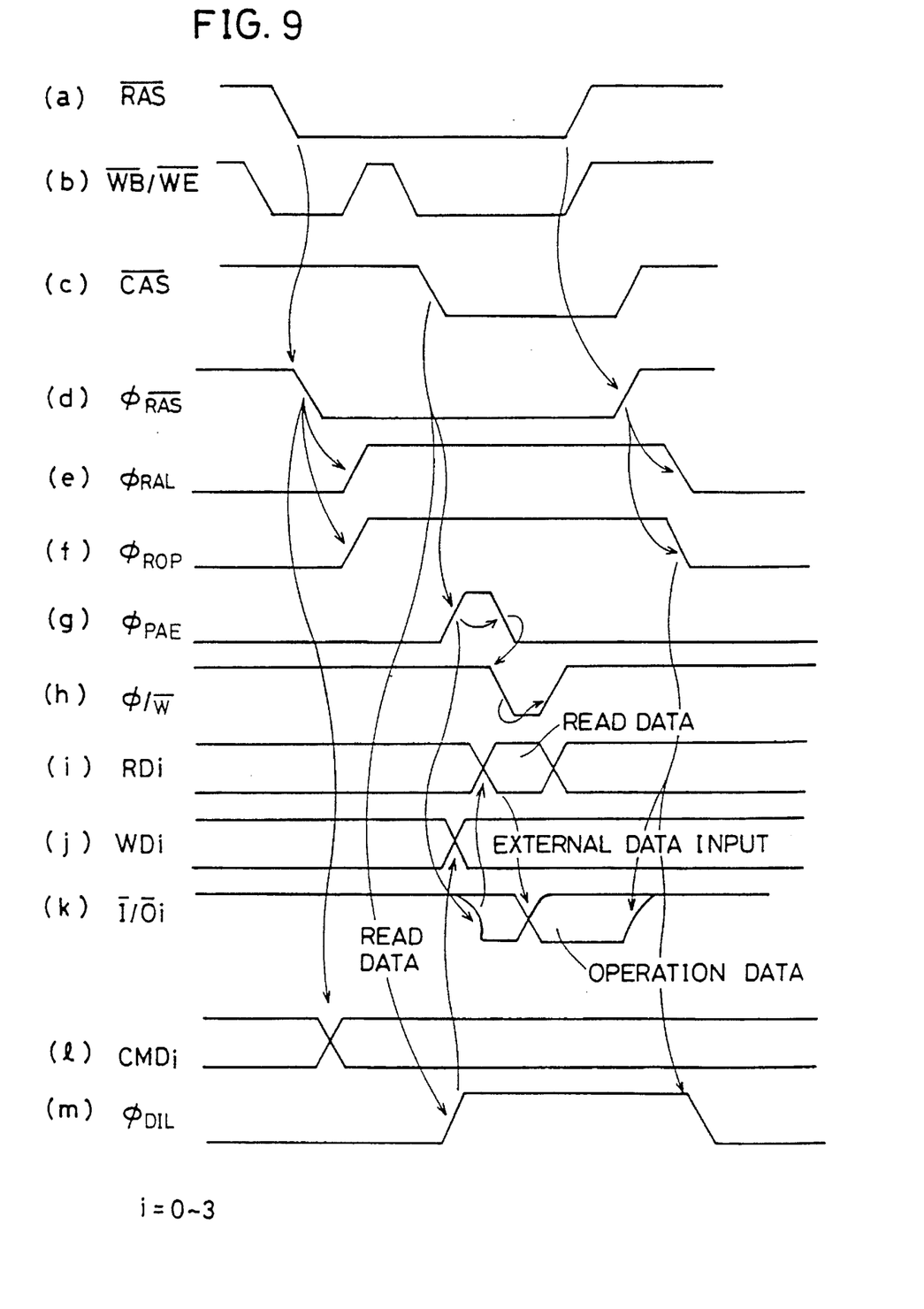
FIG. 9 is a timing chart of an internal clock signal.

FIGS. 7 and 8 are diagrams showing operation executing cycles according to one embodiment of the present invention, FIG. 7 showing a case where $\overline{WB/WE}$ is set after the fall of the $\overline{CAS}$ signal and FIG. 8 showing a case where $\overline{WB/WE}$ is set before the rise of the $\overline{CAS}$ signal. FIG. 9 is the timing chart of the respective clock signals.

Now, referring to FIGS. 1–9, more specific operations according to one embodiment of the present invention will be described. When as shown in FIG. 7 (a), the row strobe signal $\overline{RAS}$ falls to the "L" level, as shown in FIG. 7 (b), (b), the column address strobe signal $\overline{CAS}$ attains the "H" level, as shown in FIG. 7 (c), the output enable signal $\overline{DT/OE}$ attains the "H" level and as shown in FIG. 7 (d), the write enable signal $\overline{WB/WE}$ attains the "L" level, comes the operation cycle. As shown in FIG. 7 (e), the address signal is latched in the address buffer 9, whereby a row address of each of the memory cell arrays 1–4 is specified by the column decoder 6, and also as shown in FIG. 7 (f), the operation command CMD input to the data input/output terminals DO1–DO4 is latched in the CMD buffer 10.

Namely, as shown in FIG. 9 (a), when the row address strobe signal $\overline{RAS}$ falls to the "L" level, the clock signal $\Phi_{RAS}$ is falls to the "L" level as shown in FIG. 9 (d), thereby causing the NOR gate 101 shown in FIG. 6 to apply the operation command CMD to the clock driver 102. As shown in FIG. 9 (e), the operation command CMD is latched in the latch 103 at the timing at which the clock signal $\Phi_{\overline{RAL}}$ rises to the "H" level and then the operation command CMD is inverted by the inverter 104. Furthermore, the operation command CMD is inverted in the inverters 162–165 shown in FIG. 3 and the inverted operation command CMD is applied to the function block 161. As shown in FIG. 9 (f), when the clock signal $\Phi_{ROP}$ attains the "H" level, the node A of the function block 161 is precharged.

Then, as shown in FIG. 7 (b) and FIG. 9 (c), when the column address strobe signal $\overline{CAS}$ attains the "L" level, the column address signal Y latched in the address buffer 9 is applied to the row decoder 5, whereby the data in the specified addresses are read out from the memory cell arrays 1–4, and which data are applied to the operation block 8 through the I/O gate 7. As shown in FIG. 9 (g), when the clock signal $\Phi_{PAE}$ rises to the "H" level, the preamplifier 141 shown in FIG. 3 is driven to amplify a difference between the data I/O and $\overline{I/O}$, so that the amplified difference is applied to the operation block 16 through the clocked inverter 142. Furthermore, as shown in FIG. 7 (d), when the write enable signal $\overline{WB/WE}$ attains the "L" level, the clock signal $\Phi_{DIL}$ attains the "H" level as shown in FIG. 9 (m). On this occasion, since the clock signal $\Phi_{\overline{RAS}}$ is at the "L" level as shown in FIG. 9 (d), the write data input to the data input/output terminals DO1–DO4 is applied to the clock driver 122 through the NOR gate 121 shown in FIG. 6. When the clock signal $\Phi_{DIL}$ attains the "H" level, the write data is latched in the latch 123 and then applied to the operation block 16 shown in FIG. 3 through the inverter 124. Since the operation command CMD and the read data RDi are already applied to the operation block 16, an operation in accordance with the operation command CMD is executed.

The data of the execution result is applied to the NOR gates 172 and 173 through the NAND gate 160 and the inverter 171 from the node A of the function block 161. Then, as shown in FIG. 9 (h), when the clock signal $\Phi_{\overline{W}}$ attains the "L" level, the data of the operation result is applied to the writing driver 15 through the NOR gates 172 and 173 and then applied to the memory cell arrays 1–4 through the I/O gate 7. As a result, the data of the operation result is written in the predetermined address of the memory cell array.

In the above-described example shown in FIG. 7, the column address signal Y is latched in the address buffer 9 at the fall of the column address strobe signal $\overline{CAS}$, to read the data from the memory cell arrays 1–4, and the write data is latched in the input buffer 12 at the fall of the write enable signal $\overline{WB/WE}$ to perform processing and writing of the operation data. However, as shown in FIG. 8, the column address signal Y may be latched in the address buffer 9 at the fall of the column address strobe signal $\overline{CAS}$ to read the data read from the memory cell arrays 1–4 and also the write data may be latched in the input buffer 12 to perform processing and writing of the operation data by the signal of the internal timing generator 13.

As the foregoing, according to one embodiment of the present invention, since the operation command data input to the data input terminal is temporarily stored in response to a level change of the first control signal input to the first control signal input terminal and the data input to the data input terminal and the data read out from the semiconductor memory elements are operated in accordance with the operation command data in response to the level change of the second signal input to the second signal control input terminal, it is possible to set and perform an operation processing of the operation command data in the same cycle, enabling high-speed data processing.

Figure 10:
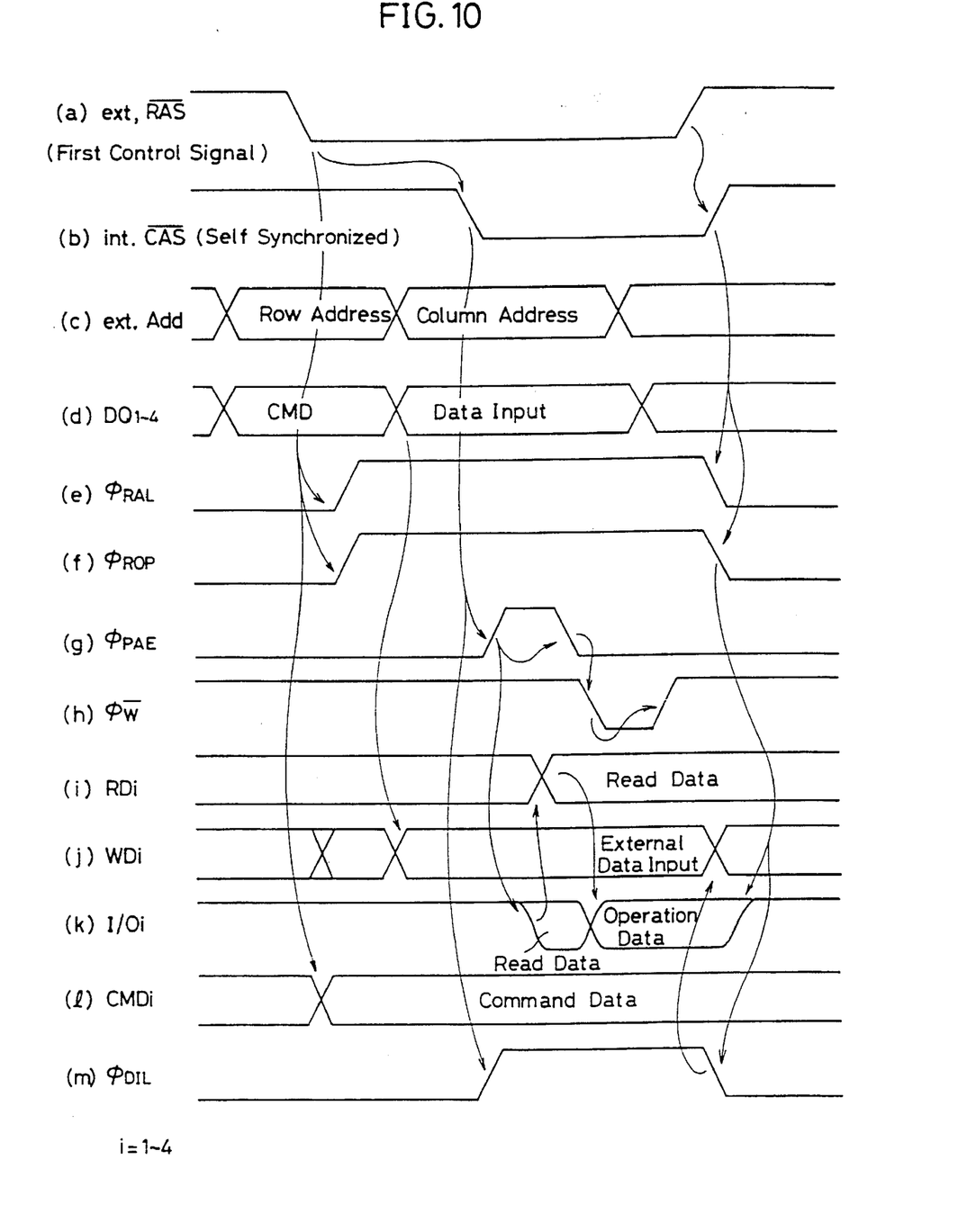
FIG. 10 is an operation timing chart according to another embodiment of the present invention.

FIG. 10 is an operation timing chart explaining operation of another embodiment of the present invention.

While in the above-described embodiment, the change of the row address strobe signal $\overline{RAS}$ is considered to be a point at which the first signal changes and the change of the column address strobe $\overline{CAS}$ is considered to be a point at which the second signal changes, the operation command CMD is latched in the CMD buffer 10 in response to a change of one signal to execute operation in the embodiment shown in FIG. 10. More specifically, when the row address strobe signal $\overline{RAS}$ shown in FIG. 10(a) falls to a "L" level, the operation command CMD is latched in the latch 103 as shown in FIG. 10(l) at a rise of the clock signals $\phi_{RAL}$ and $\phi_{ROP}$ to a "H" level in the same manner as described with reference to FIG. 9.

The row address strobe signal $\overline{RAS}$ is applied to a delay circuit (not shown) to generate an internal column address strobe signal $\overline{CAS}$ shown in FIG. 10(b). Then, the data at the designated addresses is read from the memory cell arrays 1–4 in response to a fall of the internal column address strobe signal $\overline{CAS}$ to a "L" level. When the internal column address stroke signal $\overline{CAS}$ falls to a "L" level, the block signal $\phi_{PAE}$ rises to a "H" level, thereby driving the preamplifier 141 shown in FIG. 3. The same operation as in the above-described embodiment will be performed in the reafter.

Figure 11:
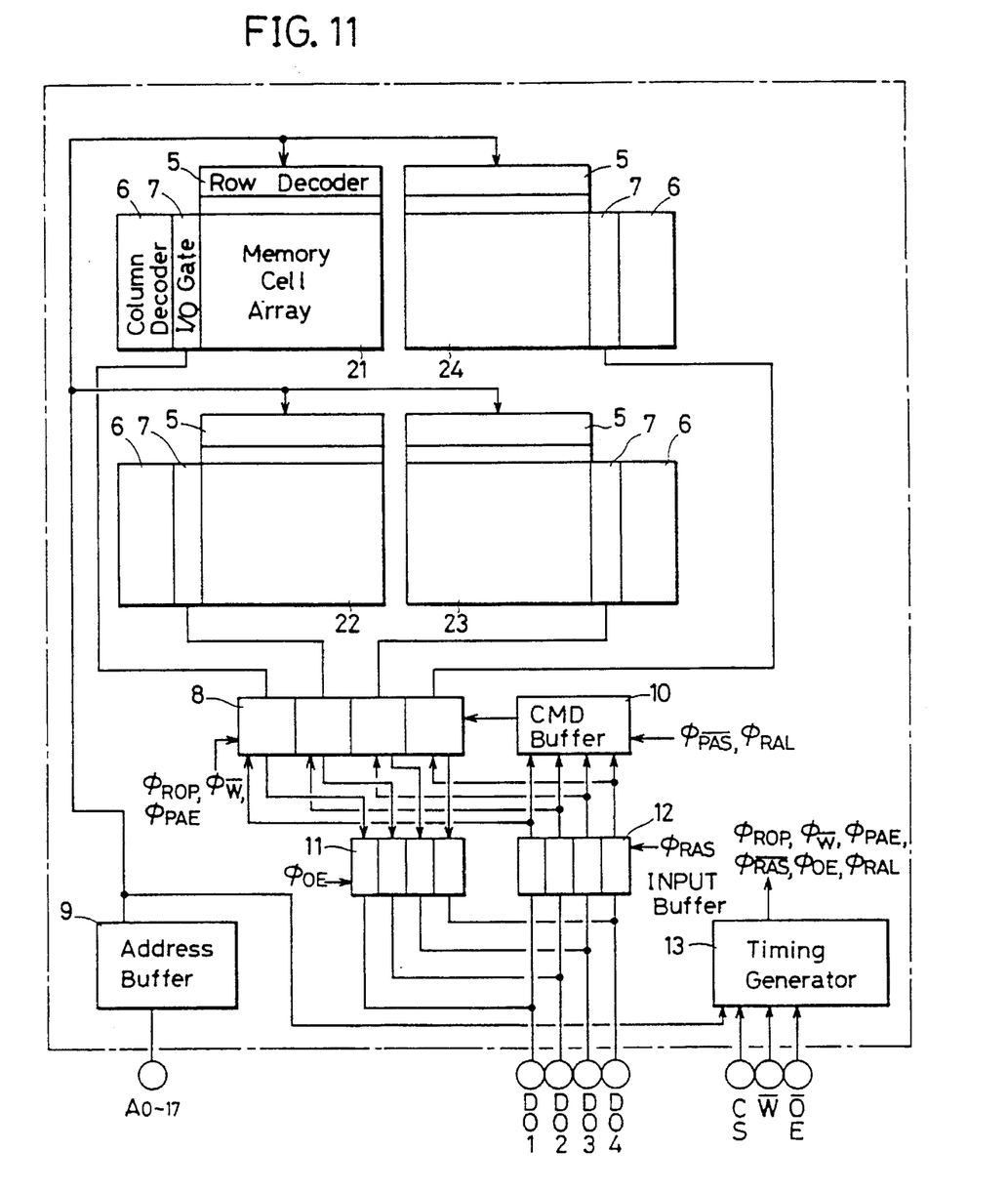
FIG. 11 is a schematic block diagram showing an embodiment of an application of the present invention to a SRAM.

FIG. 11 is a block diagram showing an embodiment of an application of the present invention to a static RAM. The embodiment of FIG. 11 is a variation of the embodiment shown in FIG. 1, with the memory cell arrays 1–4 constituting the DRAM being replaced by memory cell arrays 21–24 constituting the static RAM. Then, a part of the address signals is applied to the timing generator 13. Furthermore, the timing generator 13 receives an output enable signal $\overline{OE}$, a write signal W and a chip select signal CS.

Figure 12:
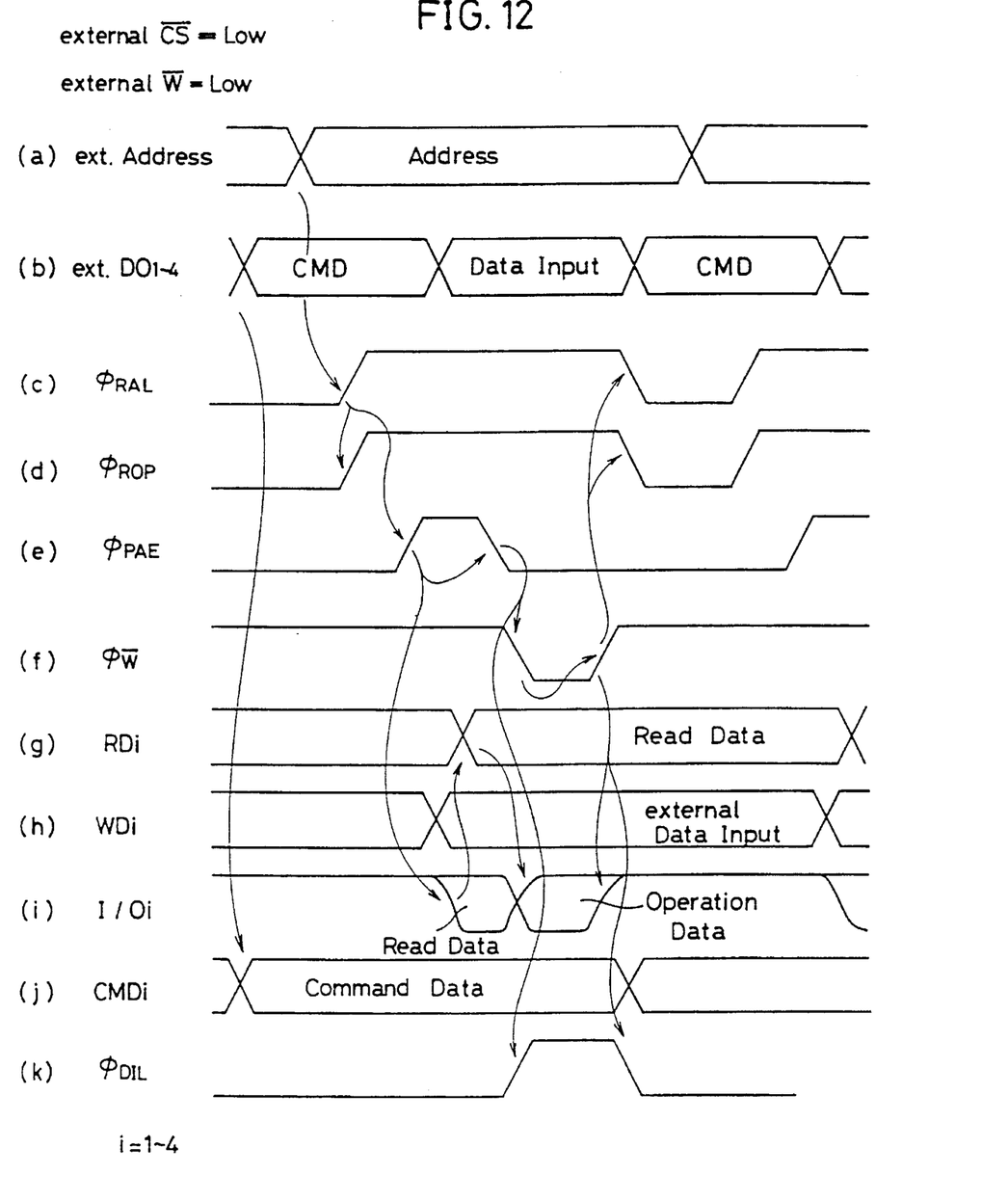
FIG. 12 is a timing chart explaining operation of the embodiment shown in FIG. 11.

FIG. 12 is a timing chart explaining operation of the embodiment shown in FIG. 11.

With reference to FIGS. 11 and 12, when a level of an address signal changes as shown in FIG. 12(a), the clock signal $\phi_{RAL}$ rises to a "H" level as shown in FIG. 12(c), so that the operation command CMD is latched in the command buffer 10 and applied to the operation block 8. When the clock signal $\phi_{RAL}$ attains the "H" level, the clock signal $\phi_{ROP}$ rises to a "H" level as shown in FIG. 12(d), and the node A in the operation block 161 shown in FIG. 3 is precharged, so that clock signal $\phi_{PAE}$ rises to a "H" level as shown in FIG. 12(e), thereby applying the data read from the memory cells 21–24 to the operation block 8. When the clock signal $\phi_{PAE}$ falls to a "L" level, the clock signal $\phi_{DIL}$ rises to a "H" level, so that write data is latched in the input buffer 12. At this time point, with the read data being applied to the operation block 8 and the write data being latched in the input buffer 12 and applied to the operation block 8 the operation is performed, so that the clock signal $\phi\overline{w}$ falls to a "L" level as shown in FIG. 12(f), thereby outputting the operation result data.

As described above, in the present embodiment, static RAMs are used as the memory cells 21–24 and the operation command CMD is latched in the command buffer 10 in response to a change of a level of a part of the address signals, in accordance with which operation command CMD, the write data applied to the data input/output terminals DO1–DO4 and the data read from the memory cells 21–24 can be operated.

Although the present invention has been described and illustrated in detail, it is clearly understood that the same is by way of illustration and example only and is not to be taken by way of limitation, the spirit and scope of the present invention being limited only by the terms of the appended claims.

What is claimed:

1. A semiconductor memory device, comprising:

a plurality of semiconductor memory elements for storing information data, address signal input terminals receiving address signals for specifying address of said plurality of semiconductor memory elements, data input/output terminals receiving the information data to be stored in said plurality of semiconductor memory elements and operation command data and outputting the information data stored in said plurality of semiconductor memory elements, the information data and operation command data being supplied to the same terminal of said data input/output terminals, storing means for temporarily storing the operation command data supplied to said data input/output terminals, and operation executing means for controlling said storing means to temporarily store said operation command data supplied to said data input/output terminals, and for executing said operation command data to operate upon information data supplied to said data input/output terminals.

2. A semiconductor memory device, comprising:

a plurality of semiconductor memory elements for storing information data, address signal input terminals receiving address signals for specifying addresses of said plurality of semiconductor memory elements, command signal input terminal means for receiving at least one command signal for controlling reading or writing information data into or from said memory elements;

data input/output terminals receiving the information data to be stored in said plurality of semiconductor memory elements and receiving operation command data and outputting the information data read out from said plurality of semiconductor memory elements, the information data and operation control data being supplied to the same terminal of said data input/output terminals, storing means for temporarily storing the operation command data supplied to said data input/output terminals, and operation executing means responsive to said at least one command signal for storing in said storing means said operation command data supplied to said data input/output terminals, and executing said operation command data to operate upon information data supplied to said data input/output terminals.

3. The semiconductor memory device according to claim 2, wherein said operation executing means includes first means responsive to said at least one command signal for generating a second command control signal, and second means responsive to said second command control signal for controlling the information data.

4. The semiconductor memory device according to claim 2, further comprising input buffer means for temporarily storing said information data and said operation command data input to said data input/output terminals before supplying said information data to said operation executing means and before supplying said operation command data to said storing means.

5. The semiconductor memory device according to claim 2, further comprising output buffer means for temporarily storing the data of the operation result by said operation executing means and outputting the same.

6. A semiconductor memory device, comprising:

a plurality of semiconductor memory elements, address signal input terminals receiving address signals for specifying addresses of said plurality of semiconductor memory elements, data input/output terminals receiving information data to be stored in said plurality of semiconductor memory elements and operation command data and outputting the information data read out from said plurality of semiconductor memory elements, the information data and the operation command data being supplied to the same terminal of said data input/output terminals, first and second control signal input terminals receiving first and second control signals for writing or reading the information data of said plurality of semiconductor memory elements, temporary storing means for temporarily storing the operation command data supplied to said input/output terminals, and operation executing means responsive to a first control signal applied to first control signal input terminal for controlling said temporary storing means to temporarily store said operation command data, and responsive to a second control signal applied to said second control signal input terminal for executing said operation command data to operate upon the information data applied to said data input/output terminals.

7. The semiconductor memory device according to claim 6, wherein said first and second control signals are produced during a common timing cycle.

8. A semiconductor memory device, comprising;

a plurality of semiconductor memory elements, address signal input terminals receiving address signals for specifying addresses of said plurality of semiconductor memory elements, data input/output terminals receiving information data to be stored in said plurality of semiconductor memory elements and operation command data and outputting the information data read out from said plurality of semiconductor memory elements, the information data and the operation command data being supplied to the same terminal of said data input/output terminals, read/write control means for writing information data to or reading the information data from said plurality of semiconductor memory elements, temporary storing means for temporarily storing operation command data applied to said input/output terminals, and operation executing means responsive to first control signal for controlling said temporary storing means to temporarily store said operation command data, and responsive to a second control signal for executing said operation command data to operation upon the information data applied to said data input/output terminals in a manner determined by said operation command data.

9. A method for executing operations to control a semiconductor memory device in which data input to a data input/output terminal is written or read to or from an element designated by an address signal input to an address signal input terminal out of a plurality of semiconductor memory elements in response to a control signal input to a control signal input terminal, the method comprising the steps of:

supplying operation command data to said data input/output terminal, temporarily storing said operation command data in response to a level change of a first control signal input to said control signal input terminal, reading data from any of said plurality of semiconductor memory elements, and operating the data input to said input/output terminal and the data read out from said plurality of semiconductor memory elements in accordance with said temporarily stored operation command data in response to a level change of a second control signal input to said control signal input terminal.

* * * * *